(12) United States Patent
Ishii

(10) Patent No.: US 7,078,250 B2
(45) Date of Patent: Jul. 18, 2006

(54) METHOD AND APPARATUS FOR MANUFACTURING ORGANIC ELECTROLUMINESCENT DEVICE, ELECTRONIC APPARATUS AND METHOD OF REMOVING IONIC IMPURITIES

(75) Inventor: Ryuji Ishii, Chino (JP)

(73) Assignee: Seiko Epson Corporation, Tokyo (JP)

( * ) Notice: Subject to any disclaimer, the term of this patent is extended or adjusted under 35 U.S.C. 154(b) by 37 days.

(21) Appl. No.: 10/623,649

(22) Filed: Jul. 22, 2003

(65) Prior Publication Data

US 2004/0137652 A1 Jul. 15, 2004

(30) Foreign Application Priority Data

Jul. 30, 2002 (JP) ........................................ 2002-221673
Jul. 10, 2003 (JP) ........................................ 2003-195296

(51) Int. Cl.
*B05D 21/06* (2006.01)

(52) U.S. Cl. .................. 438/22; 438/48; 118/719; 118/708; 427/66; 427/69; 427/126.2; 427/126.3

(58) Field of Classification Search ......... 118/708–719, 118/726–729, 129, 20; 427/66–69, 126–126.2, 427/255, 255.7, 248.1; 438/22, 48

See application file for complete search history.

(56) References Cited

U.S. PATENT DOCUMENTS 5,817,366 A * 10/1998 Arai et al. ..................... 427/66

FOREIGN PATENT DOCUMENTS

| JP | A 57-51781 | 3/1982 |
| JP | A 59-194393 | 11/1984 |
| JP | 05-327175 | 12/1993 |
| JP | 07-137294 | 5/1995 |
| JP | A 11-274671 | 10/1999 |
| JP | B2 3111905 | 9/2000 |

* cited by examiner

*Primary Examiner*—Dung A. Le
(74) *Attorney, Agent, or Firm*—Oliff & Berridge, PLC

(57) ABSTRACT

A method of manufacturing an organic electroluminescent device having a functional layer formed by at least a light emitting layer positioned between a pair of electrodes, the method includes the steps of storing a liquid material in a container, the liquid material obtained by dissolving a material for forming the functional layer in a solvent or by dispersing the material for forming the functional layer in a dispersion medium, removing clusters contained in the liquid material, supplying the liquid material to a droplet discharge head, discharging the liquid material from the droplet discharge head, and forming the functional layer by discharging the liquid material onto a substrate.

13 Claims, 8 Drawing Sheets

METHOD AND APPARATUS FOR MANUFACTURING ORGANIC ELECTROLUMINESCENT DEVICE, ELECTRONIC APPARATUS AND METHOD OF REMOVING IONIC IMPURITIES

BACKGROUND OF THE INVENTION

1. Field of the Invention

The present invention relates to a method for manufacturing an organic electroluminescent device and to an apparatus for manufacturing the same, and to an electronic apparatus and a method of removing ionic impurities.

Priority is claimed on Japanese applications No. 2002-221673, filed Jul. 30, 2002, and No. 2003-195296, filed Jul. 10, 2003, the content of which is incorporated herein by reference.

2. Description of Related Art

In recent years, as methods of manufacturing a device having a micro wiring pattern such as a semiconductor integrated circuit or methods of manufacturing an electrooptical device that forms a functional layer such as a transparent electrode or a light emitting layer on a substrate, methods that form wiring or form a film using a droplet discharge method such as an inkjet method have been attracting attention. As a method of this type in which droplets are discharged, a technology is known that relates to the manufacture of an electrical circuit using an inkjet method as is disclosed, for example, in Japanese Patent Application Laid-Open (JP-A) No. 11-274671. In this disclosed technology an electrical circuit is formed by discharging a fluid that contains a material for forming a pattern from an inkjet head onto a pattern formation surface. This technology is extremely effective due to its ability to be used in diversified Normally, a liquid material discharged from an inkjet head is formed by mixing a material for forming various functional layers such as wiring that is to be patterned on a substrate or a thin film that is to be formed on a substrate together with an organic solvent or dispersion medium. However, if, for example, the liquid material is stored for an extended period of time before it is discharged, changes sometimes occur in the state of the liquid material caused by the solvent or dispersion medium. Specifically, there are cases in which clusters and ionic impurities are created in the liquid material. In devices such as organic electroluminescent (EL) devices formed from liquid material whose state has changed in this manner and in which clusters or ionic impurities have been created the problem arises that the initial properties and life span properties are deteriorated.

The present invention was conceived in view of the above circumstances and it is an object thereof to provide a method of manufacturing an organic EL device and an apparatus for manufacturing an organic EL device that enable initial properties and life span properties to be improved when manufacturing an organic EL device using a droplet discharge method such as, for example, an inkjet method, and to an electronic apparatus and a method of removing ionic impurities.

SUMMARY OF THE INVENTION

The first aspect of the present invention is a method of manufacturing an organic electroluminescent device having a functional layer formed by at least a light emitting layer positioned between a pair of electrodes, the method has the steps of storing a liquid material in a container, the liquid material obtained by dissolving a material for forming the functional layer in a solvent or by dispersing the material for forming the functional layer in a dispersion medium, removing clusters contained in the liquid material, supplying the liquid material to a droplet discharge head, discharging the liquid material from the droplet discharge head, and forming the functional layer by discharging the liquid material onto a substrate.

According to the method of manufacturing an organic electroluminescent device of this aspect, because clusters contained in the liquid material are removed before the liquid material is supplied to the droplet discharge head, so that all clusters have been removed from the liquid material which is discharged by the droplet discharge head, it is possible to prevent any reduction in the initial properties or life span properties of the organic electroluminescent device caused by the fact that clusters are contained in the liquid material, and it is possible to prevent the occurrence of failures due to nozzle blockages and the like caused by clusters having a large grain size, while achieving a stable discharge operation.

Note that the term clusters refers generally to solid material created by chemical changes or mass transfers in the liquid material, or by changes in form or the like.

It is preferable that the clusters are removed by filtering the liquid material. This allows clusters contained in the liquid material to be removed efficiently.

It is preferable that the functional layer includes a hole injection layer, and the method has the steps of storing a liquid material in a container, the liquid material obtained by dissolving a material for forming the hole injection layer in a solvent or by dispersing the material for forming the hole injection layer in a dispersion medium, removing clusters contained in the liquid material, supplying the liquid material to a droplet discharge head, discharging the liquid material from the droplet discharge head, and forming the hole injection layer by discharging the liquid material onto a substrate.

By employing this type of structure, even when, for example, a dispersion solution of polyethylenediothiophene/polystyrenesulfonate (PEDOT/PSS) is used as the liquid material obtained by dissolving or dispersing a material for forming the hole injection layer, by removing clusters generated as a result of this, it is possible to prevent any reduction in the initial properties or life span properties of the organic electroluminescent device that is obtained.

It is also preferable that the method has the step of stirring the liquid material in the container before removing the clusters.

By employing this type of structure, because the liquid material is stirred beforehand in the container, it is subsequently possible to efficiently remove clusters contained in the liquid material.

Moreover, it is also preferable that the clusters are solid material created as a result of the material for forming the functional layer to be formed on the substrate agglomerating in the liquid material before it is discharged.

By employing this type of structure, it is possible to prevent any reduction in the initial properties or life span properties of the organic electroluminescent device caused by the fact that clusters are contained in the material for forming the functional layer in the liquid material.

The second aspect of the present invention is an apparatus for manufacturing an organic electroluminescent device having a functional layer formed by at least a light emitting layer between a pair of electrodes, has a droplet discharge head that discharges a liquid material obtained by dissolving a material for forming the functional layer in a solvent or by dispersing the material for forming the functional layer in a dispersion medium onto a substrate, a container that stores the liquid material and that positioned so as to be able to be connected to the droplet discharge head, and a cluster removal device that positioned between the container and the droplet discharge head and that removes clusters contained in the liquid material.

According to the apparatus for manufacturing an electroluminescent device of this aspect, because the liquid material is contained in a container that is connected to the droplet discharge head, and because clusters contained in the liquid material are removed in the cluster removal device positioned between the container and the droplet discharge head, it is possible to prevent any reduction in the initial properties or life span properties of the device caused by the fact that clusters are contained in the liquid material, and it is possible to prevent the occurrence of failures due to nozzle blockages and the like caused by clusters having a large grain size, while achieving a stable discharge operation.

It is preferable that the removal device is a filtration device.

By employing this type of structure, clusters contained in the liquid material can be removed efficiently and, moreover, at low cost.

It is also possible for an ionic impurity removal device to be provided between the container and the droplet discharge head.

By employing this type of structure, not only clusters, but also ionic impurities can be removed.

It is preferable that at least a portion of the removal device is formed by an ion exchanger.

By employing this type of structure, ionic impurities can also be removed by undergoing an ion exchange processing by an ion exchanger.

It is also preferable that a stirring device or an ultrasonic device is provided in the container.

By employing this type of structure, because the liquid material is stirred in the container and clusters in the liquid material are uniformly dispersed before the liquid material is moved from the container to the removal device, clusters can be efficiently dispersed in the removal device.

The third aspect of the present invention is an electronic apparatus that includes an organic electroluminescent device obtained by the above described manufacturing methods, or an organic electroluminescent device manufactured by the above described manufacturing apparatuses.

According to this electronic apparatus, because the electronic apparatus includes an organic electroluminescent device in which a reduction in initial properties or in life span properties is prevented, the electronic apparatus itself also has excellent initial properties and life span properties.

The fourth aspect of the present invention is a method for removing ionic impurities, has the steps of removing ionic impurities contained in a liquid material by ion exchange using an ion exchange material, and discharging the liquid material from a droplet discharge head.

According to this method for removing ionic impurities, because ionic impurities contained in the liquid material are removed by ion exchange, it is possible to prevent the occurrence of failures caused by the fact that ionic impurities are contained in the liquid material.

BRIEF DESCRIPTION THE DRAWINGS

DETAILED DESCRIPTION OF THE INVENTION

The present invention will now be described with reference made to the drawings.

Figure 1:
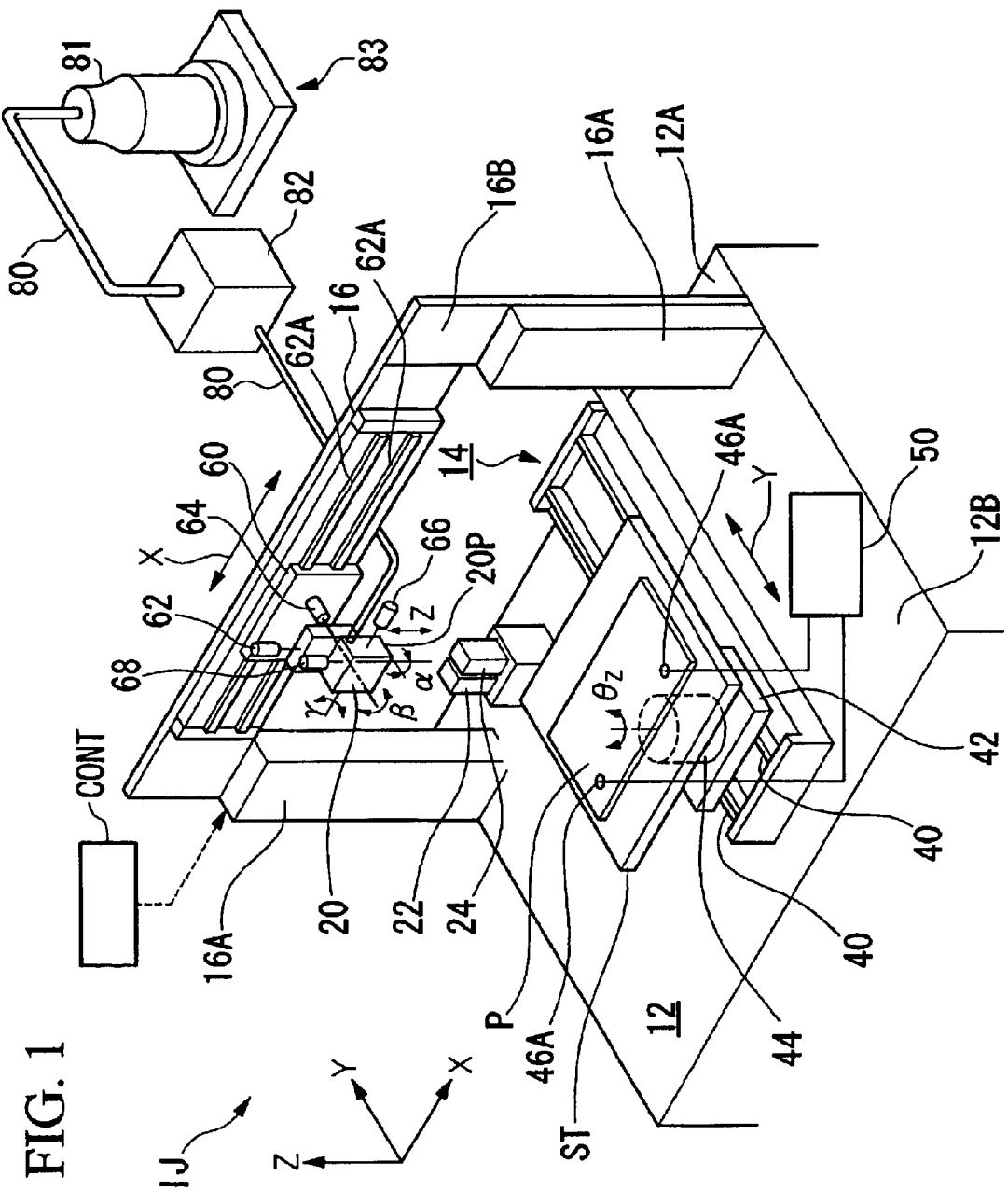
FIG. 1 is a schematic perspective view showing an embodiment of the manufacturing apparatus of the present invention.

FIG. 1 is a view showing an embodiment of the manufacturing apparatus for an organic EL device of the present invention, and is a schematic perspective view showing an inkjet device (i.e., droplet discharge device) having an inkjet head (droplet discharge head). This inkjet device corresponds to the organic EL device manufacturing apparatus of the present invention.

In FIG. 1, an inkjet device IJ is provided with a base 12, a stage ST that is positioned on the base 12 and supports a substrate P, a first moving device 14 that is positioned between the base 12 and stage ST and that movably supports the stage ST, an inkjet head 20 that is capable of discharging ink (i.e., a liquid material) containing predetermined materials onto the substrate P supported by the stage ST, a second moving device 16 that movably supports the inkjet head 20, and a control device CONT that controls ink discharge operations of the inkjet head 20. Furthermore, the inkjet device IJ has electronic scales (not shown) that operate as a weight measuring device provided on the base 12, a capping unit 22, and a cleaning unit 24. Operations of the ink-jet device IJ that includes the first moving device 14 and the second moving device 16 are controlled by the control device CONT.

The first moving device 14 is located on the base 12 and the position thereof in the Y axial direction is able to be adjusted. The second moving device 16 stands upright from the base 12 using support pillars 16A and is mounted on a rear portion 12A of the base 12. The X axial direction of the second moving device 16 is orthogonal to the Y axial direction of the first moving device 14. Here, the Y axial direction extends along the direction between the front portion 12B and the rear portion 12A of the base 12. The X axial direction extends in the left-right direction of the base 12. Each of these directions is horizontal. There is also a Z direction which is a direction perpendicular to both the X axial direction and the Y axial direction.

The first moving device 14 is formed, for example, by a linear motor and is provided with guide rails 40 and a slider 42 that is able to be moved along the guide rails 40. The slider 42 of this linear motor type of first moving device 14 is able to be positioned by being moved in the Y axial direction along the guide rails 40.

The slider 42 is also provided with a motor 44 for rotating around the Z axis (èZ). The motor 44 is, for example, a direct drive motor and a rotor of the motor 44 is fixed to the stage ST. As a result, the rotor and the stage ST can be rotated in the èZ direction by supplying power to the motor 44, thereby enabling the stage ST to be indexed (i.e., rotation indexed). Namely, the first moving device 14 can be moved in both the Y axial direction and the èZ direction.

The stage ST holds the substrate P and positions it in a predetermined position. The stage ST also has a suction holding device 50, and the substrate P is held by suction on the stage ST via a hole 46A in the stage ST when the suction holding device 50 is operated.

The second moving device 16 is formed by a linear motor and is provide with columns 16B fixed to the support pillars 16A, guide rails 62A supported by the columns 16B, and a slider 60 supported such that it can be moved in the X axial direction along the guide rails 62A. The slider 60 can be positioned by being moved in the X axial direction along the guide rails 62A, and the inkjet head 20 is mounted on the slider 60.

The inkjet head 20 has motors 62, 64, 66, and 68 that operate as swing positioning devices. When the motor 62 is operated the inkjet head 20 can be positioned by being moved up or down along the Z axis. The Z axis is substantially perpendicular to both the X axis and the Y axis (i.e., is a vertical direction). If the motor 64 is operated the inkjet head 20 can be positioned by being swung in a â direction around the Y axis. If the motor 66 is operated the inkjet head 20 can be positioned by being swung in a ā direction around the X axis. If the motor 68 is operated the ink-jet head 20 can be positioned by being swung in an a direction around the Z axis. Namely, the second moving device 16 movably supports the inkjet head 20 in both the X axial direction and the Y axial direction, and also movably supports the inkjet head 20 in the X direction (around the X axis), the èY direction (around the Y axis), and the èZ direction (around the Z axis).

In this way, the inkjet head 20 shown in FIG. 1 is able to be position by being moved rectilinearly in the Z axial direction along the slider 60, and can be positioned by being swung in the a, â, and ā directions. The position or attitude of an ink discharge surface 20P of the inkjet head 20 can be precisely controlled relative to the substrate P on the stage ST side. A plurality of nozzles that discharge ink are provided in the ink discharge surface 20P of the inkjet head 20.

Figure 2:
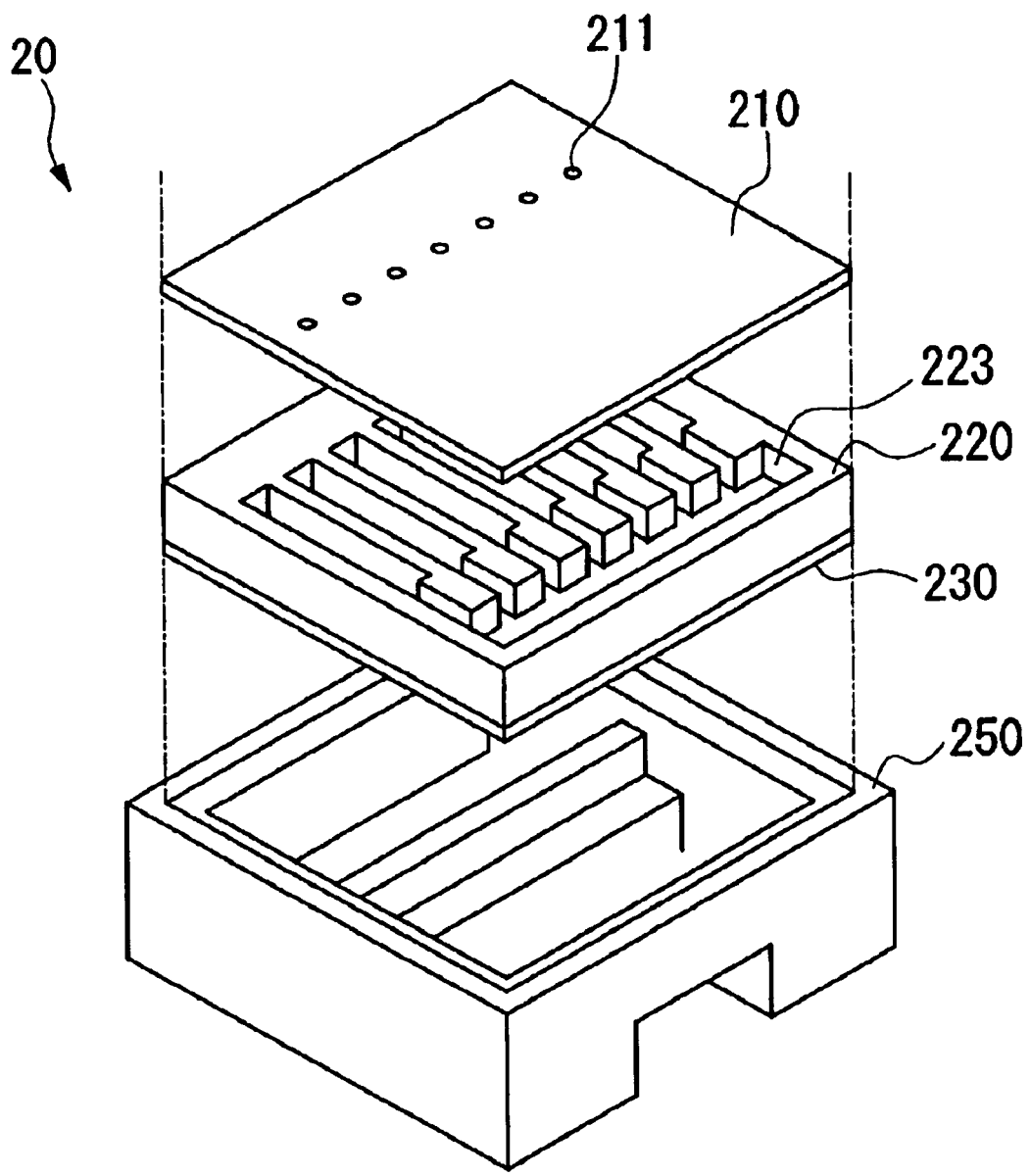
FIG. 2 is an exploded perspective view of an inkjet head.

FIG. 2 is an exploded perspective view showing the inkjet head 20.

Figure 3:
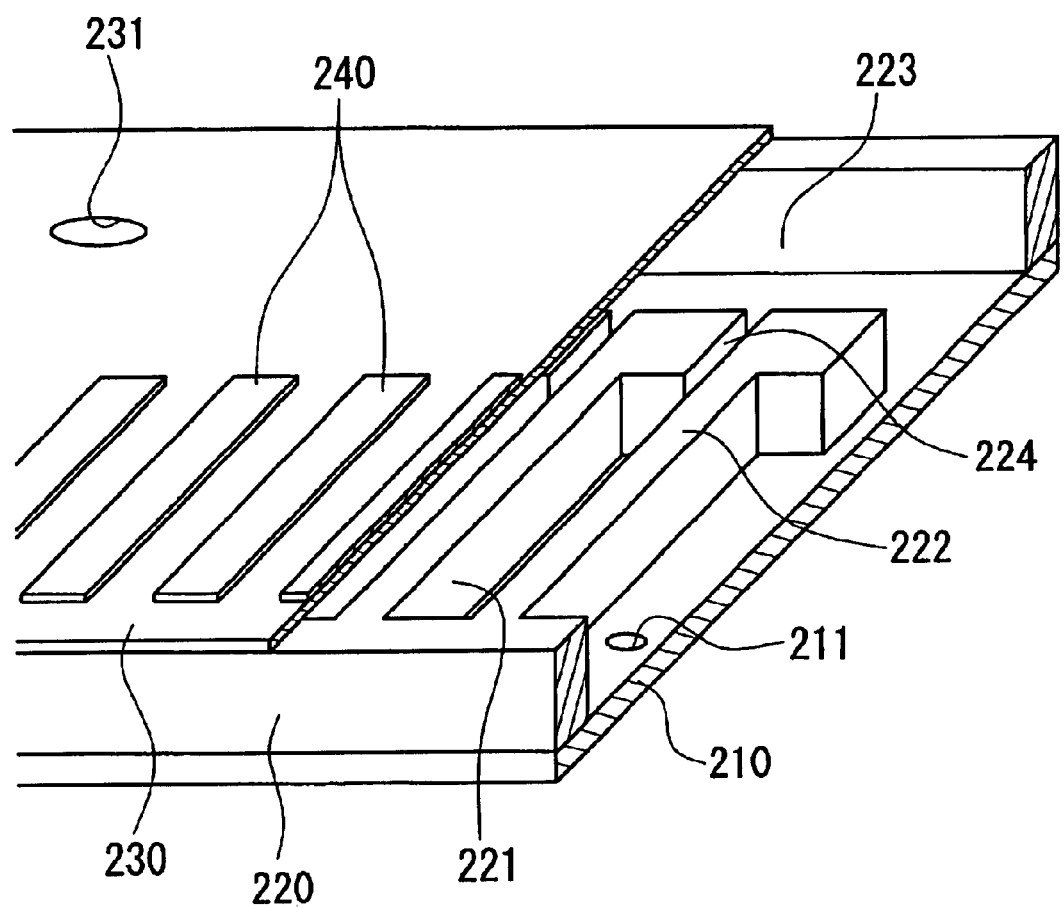
FIG. 3 is a perspective view of principal portions of an inkjet head with a portion thereof shown in cross section.

As is shown in FIG. 2, the inkjet head 20 is formed by fitting a nozzle plate 210 in which the nozzles 211 are provided and a pressure chamber substrate 220 provided with an oscillation plate 230 into a housing 250. As is shown in partial cross-section perspective view in FIG. 3, the structure of the main portions of the inkjet head 20 includes a structure in which the pressure chamber substrate 220 is sandwiched by the nozzle plate 210 and the oscillation plate 230. In the nozzle plate 210 nozzles 211 are formed at positions that correspond to cavities (i.e., the pressure chambers) formed when the nozzle plate 210 is adhered to the pressure chamber substrate 220. By etching a silicon monocrystal substrate or the like a plurality of cavities 221 that are each capable of functioning as a pressure chamber are provided in the pressure chamber substrate 220. The cavities 221 are separated by side walls (i.e., partition walls) 222. Each cavity 221 is connected via a supply aperture 224 to a reservoir 223 which is a common flow passage. The oscillation plate 230 is formed, for example, by a thermal oxidation film. An ink tank aperture 231 is provided in the oscillation plate 230 and an optional quantity of ink can be supplied through the ink tank aperture 231 via a pipe 80 that serves as a flow passage from a tank 81 (described below).

Piezoelectric elements 240 are formed on the oscillation plate 230 at positions corresponding to the cavities 221. The piezoelectric elements 240 are structured such that a piezoelectric ceramic crystal such as a PZT element is sandwiched by a top electrode and a bottom electrode (neither of which are shown). The piezoelectric elements 240 are formed such that a change in their volume can be generated in response to a discharge signal supplied from the control device CONT.

In order to discharge ink from the inkjet head 20, firstly, the control device CONT supplies the inkjet head 20 with a discharge signal that causes ink to be discharged. Ink then flows into a cavity 221 of the inkjet head 20, and a change in volume is generated in the piezoelectric element 240 in the inkjet head 20 to which the discharge signal has been supplied by voltage applied between the top electrodes and the bottom electrodes thereof. This change in volume causes the oscillation plate 230 to become deformed causing a change in the volume of the cavity 221. As a result, droplets of ink are discharged from the nozzle hole 211 of the cavity 221. In cavities 221 from which ink has been discharged, ink that has decreased in volume due to this discharge is replenished from the tank.

Note that in this inkjet head a structure is employed in which ink is discharged by generating a change in the volume of a piezoelectric element, however, it is also possible to employ a structure in which heat is applied to ink by a heating element and droplets are discharged as a result of the ink expanding.

The electronic scales (not shown) receive, for example, 5000 ink droplets from the nozzles of the inkjet head 20 in order to measure and control the weight of single droplets of ink discharged from the nozzles of the inkjet head 20. The electronic scales are able to accurately measure the weight of a single droplet of ink from each nozzle by dividing the weight of the 5000 ink droplets by the number 5000 and by the number of nozzles. Based on the measured quantity of the ink droplets, the quantity of ink droplets discharged from the inkjet head 20 can be optimally controlled.

It is also possible for the cleaning unit 24 to periodically or occasionally clean the nozzles and the like of the inkjet head 20 during a device manufacturing process or during a wait period. The capping unit 22 caps the ink discharge surface 20P during wait times when a device is not being manufactured in order to prevent the ink discharge surface 20P of the inkjet head 20 from drying out.

As a result of the inkjet head 20 being moved in the X axial direction by the second moving device 16 the inkjet head 20 can be selectively positioned above the electronic scales, the cleaning unit 24, or the capping unit 22. Namely, even in the middle of the device manufacturing process it is possible, for example, to measure the weight of the ink droplets if the inkjet head 20 is moved to the electronic scales. Alternatively, if the inkjet head 20 is moved above the cleaning unit 24 it is possible to clean the inkjet head 20. If the inkjet head 20 is moved above the capping unit 22 it is possible to attach a cap to the ink discharge surface 20P of the inkjet head 20 and prevent the ink discharge surface 20P from drying out.

Namely, the electronic scales, the cleaning unit 24, and the capping unit 22 are positioned on the base 12 at the rear end side thereof separated from the stage ST and directly below the path of movement of the inkjet head 20. Because the tasks of transporting the substrate P onto and away from the stage ST are carried out at the front end side of the base 12, the electronic scales, the cleaning unit 24, and the capping unit 22 do not obstruct these tasks.

The ink used in the present embodiment is a material in liquid form (i.e., a liquid material) obtained by mixing material for forming functional layers, such as a hole injection layer and a light emitting layer, that are provided on the substrate in an organic EL device, in particular, with an organic solvent or dispersion medium. A material having a high boiling point is preferably used as the organic solvent or dispersion medium in the case of an organic solvent that is to be used, for example, for the material for forming a light emitting layer. This type of organic solvent improves the wetness spreading of the liquid material coated on the substrate after it has been discharged from the inkjet head 20, and acts to suppress the liquid material from immediately evaporating and the like. Ink obtained by proportionally mixing a formation material with an organic solvent or dispersion medium is normally stored in a storage container, and then undergoes a preservation treatment such as being stored in a vacuum pack so that it can be retained in that state until it is required for use.

However, if the ink is preserved for an extended period of time the formation material and the organic solvent or dispersion medium that make up the ink constituent material affect each other and a change occurs in a portion of the formation material. Namely, the substances that constitute the formation material agglomerate in the liquid material, and pieces of solid material (clusters) that are larger than the constituent substances of the formation material are created.

Accordingly, as is shown in FIG. 1, a tank 81 that stores ink is connected to the inkjet head 20 via a pipe (i.e., a flow passage) 80. A filtration device (i.e., a removal device) 82 that removes clusters contained in the ink is further provided midway along the length of the pipe 80. The top portion of the tank 81 is open and one end of the pipe 80 connects with the ink inside the tank 81 via this opening.

Figure 4:
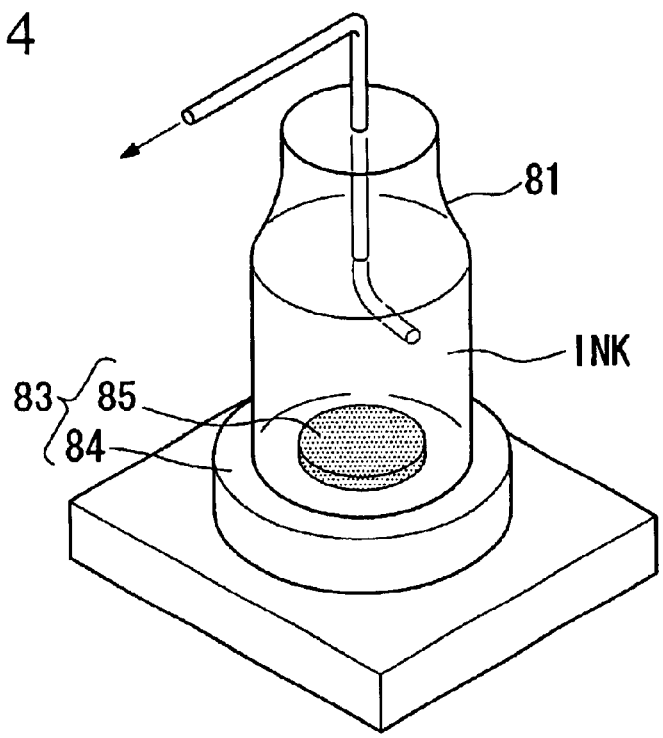
FIG. 4 is an enlarged perspective view of the vicinity of a tank.

As is shown in FIG. 4, an ink stirring device 83 is provided in the tank 81. The stirring device 83 is formed by a stirrer 84 that becomes a stage for the tank 81, and by a stirring member 85 positioned in the ink in the tank 81. The stirrer 84 is provided with a motor (not shown) whose revolution speed is able to be altered freely. Ink is stirred by imparting a magnetic field in a rotation direction around the center axis of the tank 81 so that the stirring member 85 is rotated by magnetic force inside the tank 81.

Figure 5:
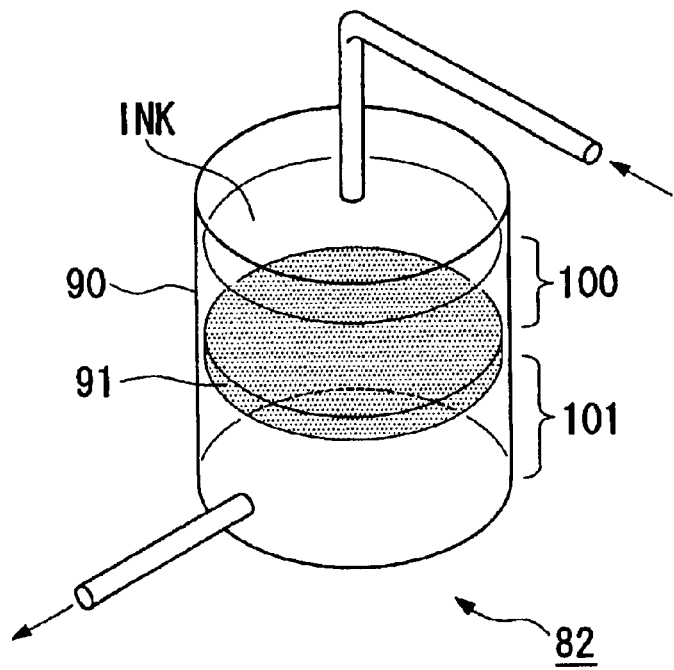
FIG. 5 is an enlarged perspective view of the vicinity of a filtration device.

As is shown in FIG. 5, the filtration device 82 is formed by a filtration container 90 in which stirred ink is stored and a filter 91 provided inside the filtration container 90. The filter 91 has the function of only removing clusters contained in the ink, and the filtration size is preferably 0.5 ìm or less and, more preferably, 0.2 ìm or less.

Next, a description will be given of a method of forming a pattern on the substrate P by discharging ink from the inkjet head 20 onto the substrate P, which is supported on the stage ST, using the above described inkjet device IJ. Note that the ink discharged here is a liquid material obtained by dissolving in a solvent or by dispersing in a dispersion medium a material for forming functional layers, such as a light emitting layer, a hole injection layer or an electron injection layer in the organic EL device described below.

Firstly, an ink (i.e., a liquid material) obtained by proportionally mixing a material for forming functional layers with an organic solvent (or dispersion medium) is stored in the tank 81. The tank 81 is mounted above the stirrer 84 and the stirrer 84 is operated. As a result, the stirring member 85 positioned in the ink in the tank 81 is rotated, the ink is thereby stirred, and the original liquid and organic solvent contained in the ink are uniformly dispersed inside the tank 81.

Next, the stirred ink is stored via the pipe 80 in the filtration container 90 provided in the filtration device 82. The stirred ink is passed through the filter 91 in the filtration container 90 so that any clusters that have formed in the ink are unable to pass through the filter 91 and are trapped. These clusters are then accumulated in a first area inside the filtration device 90 to which the ink has been supplied, and only original liquid and organic solvent that have not formed clusters pass through the filter 91 and move to a second area inside the filtration container 90 that leads to the inkjet head 20.

The control device CONT drives the inkjet head 20 and deaerated ink is discharged onto the substrate P supported by the stage ST.

As has been described above, by providing the filtration device 82 between the tank 81 that stores the ink and the inkjet head 20, even if the ink which is used has been stored for a fixed period of time and clusters have developed therein, only the clusters are removed from the ink in the filtration device 82. Moreover, by providing the stirring device 83 in the tank 81 it is possible to efficiently disperse the original liquid and organic solvent contained in the ink uniformly. Therefore, it is possible to efficiently trap clusters in the filtration device 82.

As a result, it becomes possible to prevent any reduction in the initial properties or lifespan properties of an organic EL device caused by the fact that clusters are contained in the liquid material. Furthermore, it is also possible to prevent the occurrence of failures such as nozzle blockages caused by clusters having a large grain size, and to achieve a stable discharge operation.

Note that in the present embodiment a filtration device provided with a filter is used as the device for removing clusters, however, provided that the filtration device can efficiently remove clusters in the ink, the present embodiment is not limited to a filtration device that uses a filter system.

Moreover, a stirrer and stirring member are used as the stirring device for ink in the tank, however, the stirring device also is not limited to this type and, for example, it is also possible to uniformly disperse constituent material in the ink by supplying a low vibration to the ink using an ultrasonic device.

The manufacturing apparatus for manufacturing an organic EL device of the present invention, namely, a manufacturing apparatus formed by the inkjet device (i.e., a droplet discharge manufacturing device) IJ is particularly suitable for forming functional layers in an organic electroluminescent device (organic EL device).

Figure 6:
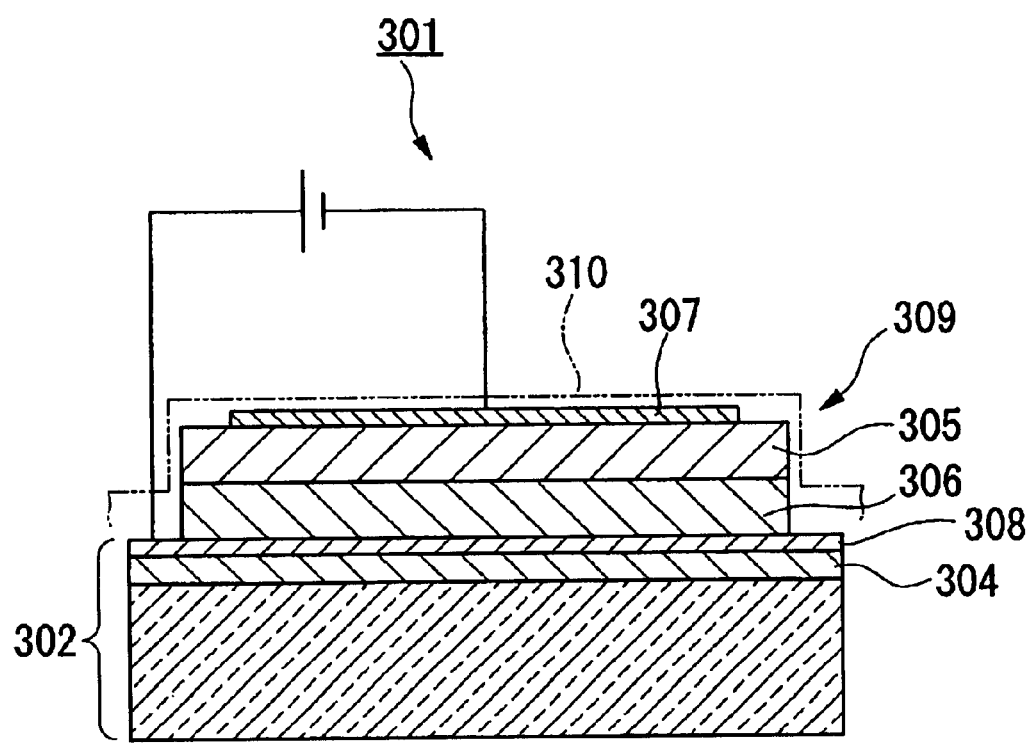
FIG. 6 is a schematic cross-sectional view showing an organic EL device.

FIG. 6 is a cross-sectional view showing an example of an organic EL device. In FIG. 6 an organic EL device 301 is formed by a substrate 302, a cathode (electrode) 307 and anode (electrode) 308 pair positioned on the surface on one side of the substrate 302, a functional layer 309 sandwiched between the electrodes 307 and 308, and a sealing layer 304 provided between the substrate 302 and the functional layer 309. In this example, the functional layer 309 is formed by a light emitting layer 305 formed from an organic electroluminescent material and by a hole injection layer 306.

Here, the organic EL device 301 shown in FIG. 6 is configured so as to take emitted light from the light emitting layer 305 from the side where the material forming the substrate 302 is located and send it to the outside of the device. The substrate 302 includes at least a transparent or semitransparent anode 308 capable of transmitting light contained in a transparent or semitransparent material capable of transmitting light. Although omitted from the present embodiment, it is also possible to form wiring or a thin film transistor in the substrate 302. Examples of the transparent or semitransparent material capable of transmitting light include transparent glass, quartz, sapphire, or transparent synthetic resins such as polyester, polyacrylate, polycarbonate, polyether ketone and the like. Low cost soda is particularly favorably used as the material for forming the substrate 302.

The anode 308 is a transparent electrode formed from indium tin oxide (ITO) or the like and is capable of transmitting light.

If, however, the organic EL device is configured so as to take emitted light from the opposite side to the material forming the substrate, the material forming the substrate may be opaque. In this case, a ceramic such as alumina, a material formed by performing an insulating treatment such as surface oxidization on a metal sheet such as stainless steel, thermosetting resin, thermoplastic resin and the like may be used. In this case, the anode 308 does not need to be capable of transmitting light.

The hole injection layer 306, in particular, has the function of improving the device characteristics such as light emission efficiency and life span of the light emitting layer 305. Examples of the material for forming (i.e., the formation material) the hole injection layer 306 include polythiophene derivatives, polypyrrole derivatives and the like as well as materials obtained by doping these. Particularly favorable is a dispersion solution of 3,4-polyethylenediothiophene/polystyrenesulfonate (PEDOT/PSS), namely, a dispersion solution obtained by dispersing 3,4-polyethylenediothiophene in polystyrenesulfonate as a dispersion medium, and then further dispersing this in water.

Instead of the hole injection layer, it is also possible to form a hole transporting layer, and also to form both a hole injection layer and a hole transporting layer. In this case, provided that the material is able to transport holes, any known hole transporting material can be used as the material for forming the hole transporting layer. As examples of such materials, various organic materials are known classified into amine systems, hydrazone systems, stilbene systems, and starburst systems and the like. If both a hole injection layer and a hole transporting layer are formed, then it is preferable, for example, prior to forming the hole transporting layer to first form the hole injection layer on the anode side and then form the hole transporting layer on top of the hole injection layer. By forming both the hole transporting layer together with the hole injection layer in this way it is possible to control rises in the drive voltage and to lengthen the drive life span (half-life).

As the material for forming the light emitting layer 305 it is possible to use low molecular weight organic light emitting dyes and macro molecular light emitting bodies, namely, light emitting substances such as various types of fluorescent substances and phosphorescent substances and organic electroluminescent materials such as Alq3 (alumichelate complexes). Among conjugated system macro molecules forming the light emitting substance, those including an arylenevinylene or a polyfluorolene structure are particularly preferable. Low molecular weight light emitting bodies that can be used include, for example, dyes such as naphthalene derivatives, anthracene derivatives, perylene derivatives, polymethine systems, Kisatene systems, coumarin systems and cyanine systems, metal complexes of 8-hydroquinoline and derivatives thereof, aromatic amines, tetraphenylcyclopentadiene derivatives and the like as well as known materials described in Japanese Patent Application Laid-Open (JP-A) Nos. 57-51781 and 59-194393. The cathode 7 is a metal electrode formed from aluminum (Al), magnesium (Mg), gold (Au), silver (Ag), or the like.

It is also possible to provide an electron transporting layer and an electron injection layer between the cathode 307 and the light emitting layer 305. There is no particular restriction on the material used to form the electron transporting layer and examples thereof include metal complexes such as oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and 8-hydroxyquinoline and derivatives thereof.

The sealing layer 304 blocks the entry of air from the outside on the substrate 302 side into the functional layer 309 containing the electrodes 307 and 308, and by appropriately selecting the film thickness and material can be made to allow light to pass therethrough. Transparent materials such as, for example, ceramic, silicon nitride, nitride oxide silicon, silicon oxide can be used as the material forming the sealing layer 304, and among these nitride oxide silicon is preferable in view of its transparency and ability to form a gas barrier. It is preferable that the thickness of the sealing layer 304 is set so as to be smaller than the wavelength of light emitted from the light emitting layer 305 (for example, 0.1 im).

Although not shown, this organic EL device 301 is an active matrix type and is actually formed with a plurality of data lines and a plurality of scan lines arranged in a matrix configuration. The functional layer 309 is connected via drive TFT such as switching transistors and driving transistors to each pixel placed in this matrix configuration partitioned by the data lines and scan lines. When a drive signal is supplied via the data lines and scan lines a current flows between the electrodes. This causes light to be emitted from the light emitting layer 305 of the functional layer 309 and this light to be irradiated onto the outer surface side of the substrate 302. As a result, the relevant pixel is lit up.

A sealing member 310 is provided on the surface of the organic EL device 301 on the opposite side to the sealing layer 304 sandwiching the functional layer 309 in order to block the entry of air into the functional layer containing the electrodes 307 and 308.

By changing the material used to form the functional layer 309 of the above described organic EL device 301, namely, the light emitting layer 305 and the hole injection layer 306 into ink (i.e., into a liquid material) using the organic solvent or dispersion medium, and then storing this ink (liquid material) in the tank 81 and stirring it, and by subsequently performing a filtration process on the ink failures such as nozzle blockages and the like can be prevented, as is described above, and an organic EL device 301 with improved initial properties and life span properties can be manufactured.

An example will now be given of an electronic apparatus fitted with this organic EL device.

Figure 7:
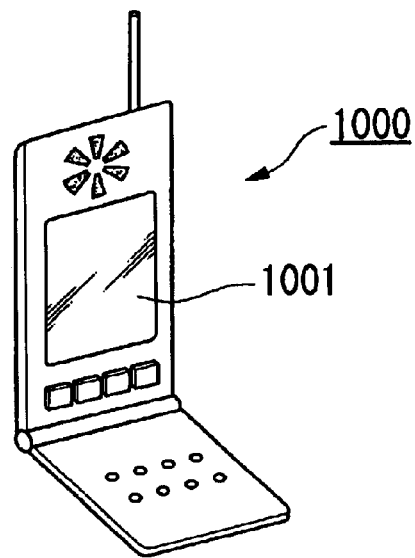
FIG. 7 is a view showing an electronic apparatus in which an organic EL device is installed.

FIG. 7 is a perspective view showing an example of a mobile telephone. In FIG. 7 the symbol 1000 indicates a main casing of a mobile telephone. The symbol 1001 indicates a display unit that employs the above described organic EL device.

Figure 8:
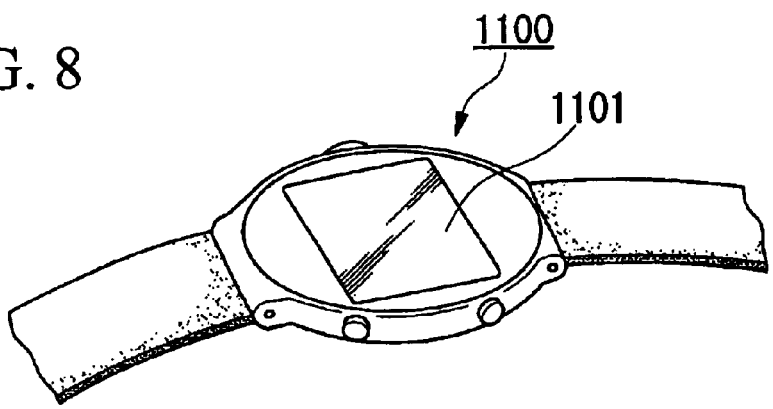
FIG. 8 is a view showing an electronic apparatus in which an organic EL device is installed.

FIG. 8 is a perspective view showing an example of a wristwatch type of electronic apparatus. In FIG. 8 the symbol 1100 indicates a watch casing. The symbol 1101 indicates a display unit that employs the above described organic EL device.

Figure 9:
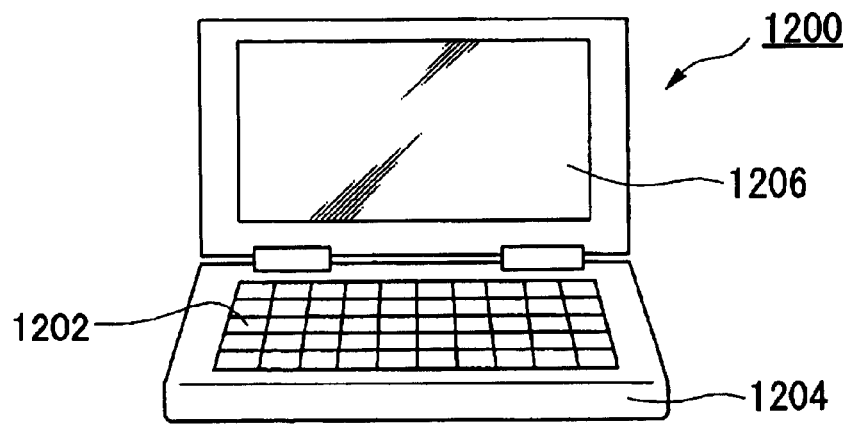
FIG. 9 is a view showing an electronic apparatus in which an organic EL device is installed.

FIG. 9 is a perspective view showing an example of a portable type of information processing apparatus such as a word processor or personal computer. In FIG. 9 the symbol 1200 indicates an information processing device. The symbol 1202 indicates an input unit such as a keyboard. The symbol 1204 indicates a main casing of the information processing apparatus, and the symbol 1206 indicates a display unit that employs the above described organic EL device.

The electronic apparatuses shown in FIGS. 7 to 9 are provided with the organic El device of the above described embodiment as a display unit, therefore, these electronic apparatuses themselves and, particularly, the display units thereof have excellent initial properties and life span properties.

Next, a description will be given of an experiment to confirm the effect when filtration processing is performed on this ink (liquid material) and of the results of this experiment.

Firstly, in order to form the hole injection layer of the organic EL device, a film of ink (liquid material) in which PEDOT/PSS is used as the material for forming the functional layer (i.e., the hole injection layer) is formed on an ITO substrate. An aluminum layer is then formed on top of this film. Using two types of ink having different composition ratios, the drive life span and initial resistance value of the elements relative to the preservation time of the inks were confirmed.

Two types of organic solvent were used in the ink, namely, NMP (N-methyl-2-pyrrolidinone) and DMI (1,3-dimethyl-2-imidazolidinone). The mixture ratios of PEDOT and PSS in the PEDOT/PSS were set at 1:20. The composition ratios of the inks were as follows. For the first ink (referred to below as PEDOT 1) the ratio of PEDOT/PSS:NMP:DMI was set at 22.4:27.6:50. For the second ink (referred to below as PEDOT 2) the ratio of PEDOT/PSS:NMP:DMI was set at 14:22:50.

Figure 10:
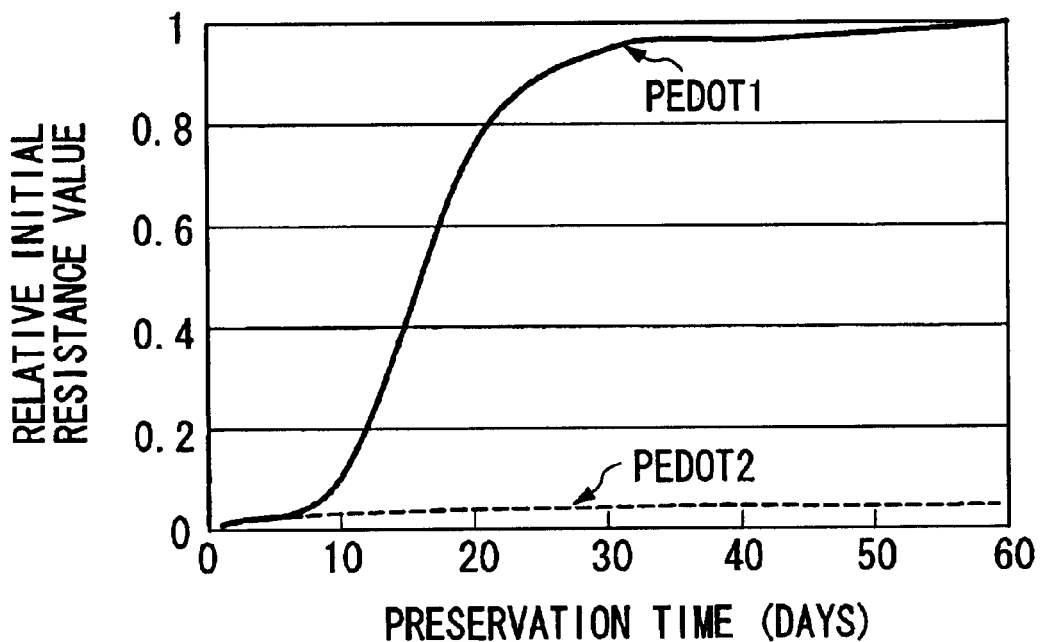
FIG. 10 is a view showing a result of a measurement to confirm an effect of the manufacturing method of the present invention.
Figure 11:
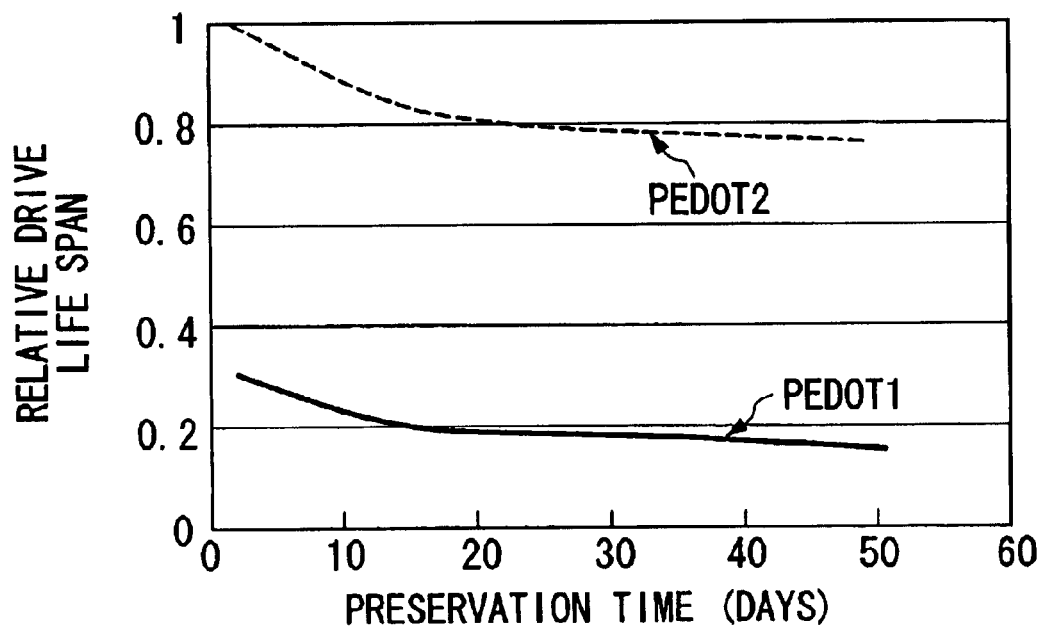
FIG. 11 is a view showing a result of a measurement to confirm an effect of the manufacturing method of the present invention.

As is shown in FIG. 10, it was discovered that, as the preservation time of the ink after it was made was lengthened, the initial properties of the elements of both PEDOT 1 and 2 were raised. Furthermore, as is shown in FIG. 11, it was discovered that, as the preservation time of the ink was lengthened, the life spans of the elements of both PEDOT 1 and 2 were reduced. This was due to the fact that the PSS and water content of a portion of the PEDOT/PSS was dissolved in the DMI and NMP organic solvents, and clusters were generated as a result of the PEDOT/PSS whose components had dissolved becoming agglomerated. The conclusion from this was that the component structure of the overall original material had changed.

Next, by performing filtration processing on PEDOT 1 and 2 the clusters created in the ink were removed. The filtration size of the filter provided in the filtration device was 0.2 ìm.

Figure 12:
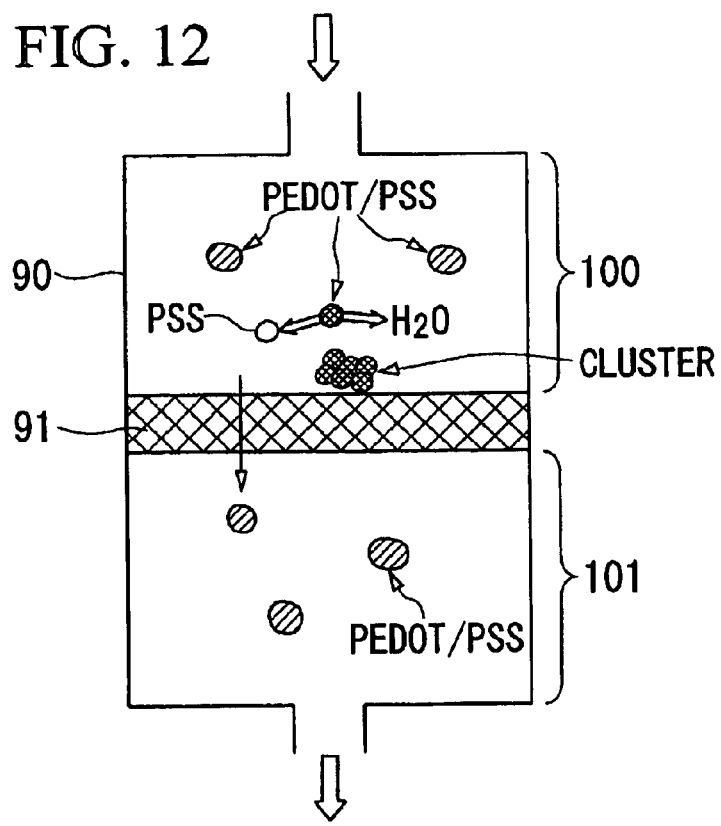
FIG. 12 is a conceptual view explaining the removal of a cluster in a filtration device.

As is shown in FIG. 12, the created clusters are trapped by the filter 91 in an area 100 of the filtration container 90 where the ink is introduced after it has been stirred. Normal PEDOT/PSS in which the PSS and water content has not dissolved can pass through the filter 91 and move to the area 101 that is connected to the inkjet head 20.

As a result, when the initial resistance values of films created using PEDOT 1 and PEDOT 2 on the 25th day of their preservation time were compared, it was found that the initial resistance value of PEDOT 2 was approximately ½3rd that of PEDOT 1. In particular, the drive life span had been improved by a factor of approximately 5 by performing the stirring and filtration processing on the ink.

Next, the method of removing ionic impurities of the present invention will be described.

This method is performed prior to the discharge, in particular, of liquid material from the inkjet head 20 of the inkjet apparatus IJ, for example, prior to the discharge of the liquid material containing the material for forming the functional layer 309 of the organic EL device 301 described above.

Namely, in this method, ionic impurities contained in the liquid material are removed by ion exchange using an ion exchange material.

Ionic impurities include cations and anions and the ion exchange material can be appropriately selected and used in accordance with the liquid material being processed. Examples of cations include various types of metal ions, and specific examples thereof include metal ions belonging to the Ia group, IIa group, VIa group, VIIa group and IIb group of the periodic table. Examples of anions include inorganic ions such as sulfate ions ($SO_4^{2-}$), formate ions ($HCO_2^-$), oxalate ions ($C_2H_4^{2-}$), and acetate ions ($CH_3COO^-$) as well as organic ions.

Ion exchange resins and inorganic ion exchange materials are used as the ion exchange material. In addition, ion exchange materials also having a mechanical filtration function are also favorably used.

Examples of an ion exchange resin, in particular, one for removing cations, namely examples of a cation exchange resin include strong acid ion exchange resins, weak acid ion exchange resins, chelate resins capable of selectively removing heavy metals, and the like. These are formed by introducing various functional groups such as $-SO_3M$, $-COOM$, $-N=(CH_2COO)_2M$, and the like in the principal chain of various polymers such as styrene systems, methacrylic systems, acrylic systems and the like. The functional group can be appropriately selected in accordance with the type of cation exchange resin and the like.

Examples of an anion exchange resin for removing anions include maximum strength basic anion exchange resins, strong basic anion exchange resins, medium basic anion exchange resins, weak basic anion exchange resins and the like. These are formed by introducing various functional groups such as a quaternary ammonium base, tertiary amine and the like in the principal chain of various polymers such as styrene systems, acrylic systems and the like. The functional group can be appropriately selected in accordance with the type of anion exchange resin and the like.

These ion exchange resins are used in fibrous form, or in the form of a woven cloth or non-woven cloth made from this fabric, or in granular form, or in a variety of configurations. Fibrous resins or filters made from woven cloth or unwoven cloth, and granular resins are used in the inkjet apparatus IJ shown in FIG. 1, particularly by being inserted in place of the filter 91 in the filtration device 82 shown in FIG. 5. By inserting an ion exchange resin in place of the filter 91 in this manner, the filtration device 82 functions as an ionic impurity removal device.

Namely, by passing through this ionic impurity removal device (i.e., the filtration device 82) a liquid material obtained by dissolving in an organic solvent or by dispersing in a dispersion medium the material for forming a functional layer, for example, the material for forming the light emitting layer or the material for forming the hole injection layer of the organic EL device, ionic impurities in the liquid material, for example, metallic ions originating in the material for forming the light emitting layer or in the material for forming the hole injection layer, or sulfate ions ($SO_4^{2-}$) originating in the polystyrene sulfonate in the PEDOT/PSS, which is the material for forming the hole injection layer, can be ion exchanged and removed.

Moreover, the inorganic ion exchange material is formed by a metal salt such as a metallic oxide and various types thereof exist. Namely, a type that performs ion exchange by absorbing cations, a type that performs ion exchange by absorbing anions, and a type that performs ion exchange by absorbing both cations and anions.

Examples of a type of inorganic ion exchange material that performs ion exchange on cations include a hydrate of antimony pentoxide ($Sb_2O_5$) (for example, IXE [registered trademark]-300 manufactured by Toa Gosei Chemical Industry Co., Ltd.), titanium phosphate (for example, IXE

[registered trademark]-400 manufactured by Toa Gosei Chemical Industry Co., Ltd.), and zirconium phosphate (for example, IXE [registered trademark]-100 manufactured by Toa Gosei Chemical Industry Co., Ltd.). In particular, because a hydrate of antimony pentoxide has high absorption selectivity for Na ions, it is preferable as an inorganic ion exchange material for a liquid material that contains the material for forming the hole injection layer (PEDOT/PSS). This is because a large number of Na ions are contained as ionic impurities in the material for forming the hole injection layer.

Examples of a type of inorganic ion exchange material that performs ion exchange on anions include hydrous bismuth oxide (for example, IXE [registered trademark]-500 manufactured by Toa Gosei Chemical Industry Co., Ltd.) and lead phosphate hydroxide (for example, IXE [registered trademark]-1000 manufactured by Toa Gosei Chemical Industry Co., Ltd.). In particular, because hydrous bismuth oxide has a high absorption selectivity as regards sulfate ions ($SO_4^{2-}$) ions, together with a hydrate of antimony pentoxide it is preferably used as an inorganic ion exchange material for a liquid material that contains the material for forming the hole injection layer (PEDOT/PSS). The reason for this is that because polystyrene sulfonate is used as the dispersion medium for the material for forming the hole injection layer, when the Na ions in particular are ion exchanged in the hydrate of antimony pentoxide this causes the sulfate ions to be liberated.

Examples of a type that performs ion exchange by absorbing both cations and anions include zirconium oxide and hydrous zirconium oxide, hydrous titanium oxide as well as antimony and bismuth based materials (for example, IXE 600 and IXE [registered trademark]-633 manufactured by Toa Gosei Chemical Industry Co., Ltd.). If this type of ion exchange material is used then Na ions contained in conventional material for forming hole injection/ transporting layers described above can be ion exchanged and, at the same time, it can be anticipated that liberated sulfate ions can also be ion exchanged.

These inorganic ion exchange materials are in granular or powder form and, in the same way as for the ion exchange resins described above, are used in the ink-jet apparatus IJ shown in FIG. 1, particularly by being inserted in place of the filter 91 in the filtration device 82 shown in FIG. 5. By inserting an inorganic ion exchange material in place of the filter 91 in this manner, the filtration device 82 functions as an ionic impurity removal device in the same way as the ion exchange resin described above.

Moreover, although these ion exchange resins and inorganic ion exchange resins have an ion exchange function and are, accordingly, able to selectively remove ionic impurities, they do not have a function of mechanically filtering solid material, for example, the above described clusters. Therefore, in particular, when this method for removing ionic impurities is used by the inkjet apparatus IJ shown in FIG. 1 for application in a device manufacturing method, for example, a method for manufacturing an organic El device, it is preferable that both clusters and ion impurities be removed by using a filtration device 82 in which the ion exchange material (i.e., an ion exchange resin or an inorganic ion exchange material) has been inserted in place of the filter 91, as described above, while at the same time using a filtration device 82 in which the filter 91 has been inserted.

Figure 13:
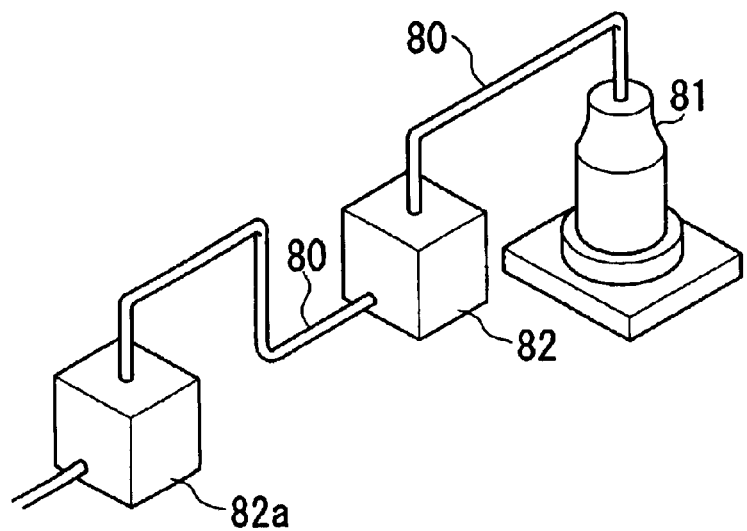
FIG. 13 is a view showing an example using an ionic impurity removal device.

Specifically, as is shown in FIG. 13, by connecting a filtration device 82 equipped with the filter 91 to the tank 81 via the pipe 80, and by also connecting an ionic impurity removal device 82a equipped with an ion exchange material (i.e., an ion exchange resin or an inorganic ion exchange material) in place of the filter 91 to the filtration device 82 via the pipe 80, it is possible to remove both clusters and ionic impurities. Namely, by mechanically filtering solid material such as clusters contained in the liquid material (i.e. a liquid material containing material for forming a functional layer) stored in the tank 81 using the filtration device 82, and by further removing ionic impurities contained in this liquid material using the ionic impurity removal device 82a, a sufficiently purified liquid material can be formed. Accordingly, an excellent functional layer can be formed by discharging this liquid material from the inkjet head 20. As a result, it is possible to prevent any deterioration in the functioning of the functional layer caused by impurities such as clusters and ionic impurities.

In a filtration device 82 equipped with the filter 91 it is also possible to provide an ion exchange material (i.e., an ion exchange resin or an inorganic ion exchange material) either above or below the filter 91. This enables a function of removing ionic impurities to be added to a single filtration device 82. Accordingly, it is possible to form an excellent functional layer by using this type of device as well, and as a result, it is possible to prevent any deterioration in the functioning of a functional layer caused by impurities such as clusters and ionic impurities.

It is also possible to use an ion exchange material having a mechanical filtration function in place of the ion exchange resin or inorganic ion exchange material as the ion exchange material. As this type of ion exchange material having a filtration function, for example, a filter obtained by chemically modifying a polyethylene porous film using a cation exchange base or an anion exchange base can be used. Specifically, "Ion Clean" (trade name) manufactured by Nippon Pole Co., Ltd. is favorably used. This product is obtained by modifying the interior of micro holes in a polyethylene film with an ion exchange base, and rapidly removes metal ions that constitute ionic impurities from a liquid material using a convection current support effect.

It is also possible to use materials formed from cellulose fibers, acid washed diatomaceous earth, and resins as well as materials formed by including strong ion exchange resins in the above materials. In this case, specifically, "Ion Clean" (trade name) manufactured by Nippon Pole Co., Ltd. and the like is favorably used.

These ion exchange materials, namely, these ion exchange materials having a mechanical filtration function, are used in the inkjet apparatus IJ shown in FIG. 1, particularly by being inserted in place of the filter 91 in the filtration device 82 shown in FIG. 5. By inserting an ion exchange material having a mechanical filtration function in place of the filter 91 in this manner, the filtration device 82 not only functions merely as an ionic impurity removal device, but also has a function of mechanically filtrating solid material such as clusters.

Accordingly, by passing liquid material, for example, the liquid material containing the material for forming the functional layer of the organic EL device described above through the filtration device 82 (i.e., a filtration device with an ion exchange material having a mechanical filtration function in place of the filter 91), not only can ion impurities in the liquid material be removed, but it is also possible for solid material such as clusters to be removed at the same time. Accordingly, it is possible to form an excellent functional layer by discharging this liquid material from the inkjet head 20, and as a result, it is possible to prevent any deterioration in the functioning of a functional layer that is caused by impurities such as clusters and ionic impurities.

In the present embodiment a description is given of when the method of removing ionic impurities of the present invention is applied, particularly, to the formation of a functional layer (i.e., a light emitting layer or a hole transporting layer) in an organic EL device, however, it is to be understood that the present invention is not limited to this and may also be applied to material for forming functional layers in various devices such as liquid crystal devices and semiconductor devices, and for the purification of all types of liquid materials discharged from a droplet discharge head such as various types of medicines.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A method of manufacturing an organic electroluminescent device having a functional layer formed by at least a light emitting layer positioned between a pair of electrodes, the method comprising the steps of:

storing a liquid material in a container, the liquid material obtained by dissolving a material for forming the functional layer in a solvent or by dispersing e material for forming the functional layer in a dispersion medium;

removing clusters contained in the liquid material;

supplying the liquid material to a droplet discharge head;

discharging the liquid material from the droplet discharge head; and forming the functional layer by discharging the liquid material onto a substrate.

2. A method of manufacturing an organic electroluminescent t device according to claim 1, wherein the clusters are removed by filtering the liquid material.

3. A method of manufacturing an organic electroluminescent device according to claim 1, wherein the functional layer includes a hole injection layer, and the method comprising the steps of:

storing a liquid material in a container, the liquid material a tamed by dissolving a material for forming the hole injection layer in a solvent or by dispersing the material for forming the hole injection layer in a dispersion medium;

removing clusters contained in the liquid material;

supplying the liquid material to a droplet discharge head;

discharging the liquid material from the droplet discharge head; and forming the hole injection layer by discharging the liquid material onto a substrate.

4. A method of manufacturing an organic electroluminescent device according to claim 1, the method further comprising the step of stirring the liquid material in the container before removing the clusters.

5. A method of manufacturing an organic electroluminescent device according to claim 1, wherein the clusters are solid material created as a result of the material for forming the functional layer to be formed on the substrate agglomerating in the liquid material before it is discharged.

6. An apparatus for manufacturing an organic electroluminescent device having a functional layer formed by at least a light emitting layer between a pair of electrodes, comprising:

a droplet discharge head that discharges a liquid material obtained by dissolving a material for forming the functional layer in a solvent or by dispersing the material for forming the functional layer in a dispersion medium onto a substrate;

a container that stores the liquid material and that positioned so as to be able to be connected to the droplet discharge head; and a cluster removal device that positioned between the container and the droplet discharge head and that removes clusters contained in the liquid material.

7. An apparatus for manufacturing an organic electroluminescent device according to claim 6, wherein the removal device is a filtration device.

8. An apparatus for manufacturing an organic electroluminescent device according to claim 6, further comprising:

an ionic impurity removal device provided between the container and the droplet discharge head.

9. An apparatus for manufacturing an organic electroluminescent device according to claim 6, wherein at least a portion of the removal device is formed by an ion exchanger.

10. An apparatus for manufacturing an organic electroluminescent device according to claim 6, wherein a stirring device is provided in the container.

11. An apparatus for manufacturing an organic electroluminescent device according to claim 6, wherein an ultrasonic device is provided in the container.

12. An electronic apparatus comprising:

an organic electroluminescent device obtained by the manufacturing method according to claim 1.

13. An electronic apparatus comprising:

an organic electroluminescent device manufactured by the apparatus according to claim 6.

* * * * *